(12) United States Patent
Alhuraifi et al.

(10) Patent No.: US 11,733,423 B2
(45) Date of Patent: Aug. 22, 2023

(54) DETERMINATION OF A SURFACE LEAK RATE IN AN INJECTION WELL

(71) Applicant: Saudi Arabian Oil Company, Dhahran (SA)

(72) Inventors: Mohammed A. Alhuraifi, Al-Qatif (SA); Rashad I. Al-Milad, Abqaiq (SA)

(73) Assignee: Saudi Arabian Oil Company, Dhahran (SA)

( * ) Notice: Subject to any disclaimer, the term of this patent is extended or adjusted under 35 U.S.C. 154(b) by 610 days.

(21) Appl. No.: 16/598,787

(22) Filed: Oct. 10, 2019

(65) Prior Publication Data

US 2021/0109251 A1 Apr. 15, 2021

(51) Int. Cl.
*G01V 99/00* (2009.01)
*G06F 30/20* (2020.01)
(Continued)

(52) U.S. Cl.
CPC ............ *G01V 99/005* (2013.01); *E21B 47/06* (2013.01); *E21B 47/117* (2020.05); *G01M 3/26* (2013.01); *G06F 30/20* (2020.01); *E21B 43/16* (2013.01)

(58) Field of Classification Search
CPC ..... G01V 99/005; E21B 47/06; E21B 47/117; E21B 43/16; E21B 2200/20;
(Continued)

(56) References Cited

U.S. PATENT DOCUMENTS

2009/0276100 A1  11/2009  Malki et al.
2010/0315630 A1  12/2010  Ramos et al.
(Continued)

FOREIGN PATENT DOCUMENTS

GB       2305724 A  *  4/1997  ............ E21B 23/08
WO    WO 2017192263        11/2017

OTHER PUBLICATIONS

Nasser et al., "Calculating casing leak cross flow rate using surface injection data," SPE-188107-MS, presented at the SPE Kingdom of Saudi Arabia Annual Technical Symposium and Exhibition, Dammam, Saudi Arabia, Apr. 24-27, 2017, 15 pages.
(Continued)

*Primary Examiner* — Rehana Perveen
*Assistant Examiner* — Troy A Maust
(74) *Attorney, Agent, or Firm* — Fish & Richardson P.C.

(57) ABSTRACT

Methods for determination of surface leak rates in an injection well after determining a presence of a surface leak based on visual identification of a leak typically associated with abnormal decrease in surface injection pressure. An injection well performance model is generated based on a reservoir pressure of the injection well, a fluid injection pressure, and properties of an injection fluid. The injection well performance model is calibrated using a shut-in bottomhole pressure and injection data measured prior to the determining of the presence of the surface leak. A production well model is generated from the injection well performance model. For each pressure value between the pressure of the injection well measured at the surface and a shut-in wellhead pressure (SIWHP), the production well model is executed to determine a flow rate of the surface leak.

17 Claims, 6 Drawing Sheets

(51) Int. Cl.
*E21B 47/117* (2012.01)
*E21B 47/06* (2012.01)
*G01M 3/26* (2006.01)
*E21B 43/16* (2006.01)

(58) Field of Classification Search
CPC ...... E21B 41/0092; E21B 33/00; G01M 3/26; G06F 30/20; G06F 30/25; G06F 30/27; G06F 30/28; G06F 2111/00–2119/22
See application file for complete search history.

(56) References Cited

U.S. PATENT DOCUMENTS

| | | |
|---|---|---|
| 2015/0378052 A1 | 12/2015 | Al-Ajmi et al. |
| 2017/0321522 A1* | 11/2017 | Al-Hajri ............... E21B 47/117 |
| 2018/0066517 A1* | 3/2018 | Davila ................... E21B 47/06 |
| 2018/0114281 A1* | 4/2018 | Babin ............. G06Q 10/06393 |
| 2019/0136686 A1 | 5/2019 | Al-Hajri et al. |

OTHER PUBLICATIONS

PCT International Search Report and Written Opinion in International Appln. No. PCT/US2020/054824, dated Dec. 4, 2020, 15 pages.
GCC Examination Report in GCC Appln. No. GC 2020-40615, dated Oct. 14, 2021, 4 pages.

* cited by examiner

```
┌─────────────────────────────────────────────────────────────────────┐
│ Determine a presence of a surface leak in an injection well         │
│ associated with a decrease in a pressure measured at a surface      │
│ of the injection well                                               │
│                              504                                    │
└─────────────────────────────────────────────────────────────────────┘
                                   │
                                   ▼
┌─────────────────────────────────────────────────────────────────────┐
│ Generate, by a computer system, an injection well performance       │
│ model of the injection well based on a reservoir pressure, a fluid  │
│ injection pressure, properties of an injection fluid used in the    │
│ injection well, and dimensions of the injection well                │
│                              508                                    │
└─────────────────────────────────────────────────────────────────────┘
                                   │
                                   ▼
┌─────────────────────────────────────────────────────────────────────┐
│ Calibrate, by the computer system, the injection well performance   │
│ model using a shut-in bottom-hole pressure and injection data of    │
│ the injection well, the shut-in bottom-hole pressure and the        │
│ injection data measured prior to the determining of the presence    │
│ of the surface leak, the injection data comprising a fluid          │
│ injection rate and a fluid injection pressure                       │
│                              512                                    │
└─────────────────────────────────────────────────────────────────────┘
                                   │
                                   ▼
┌─────────────────────────────────────────────────────────────────────┐
│ Generate, by the computer system, a production well model of the   │
│ injection well from the injection well performance model           │
│                              516                                    │
└─────────────────────────────────────────────────────────────────────┘
                                   │
                                   ▼
┌─────────────────────────────────────────────────────────────────────┐
│ For each pressure value of a plurality of pressure values between   │
│ the pressure measured at the surface and a shut-in wellhead         │
│ pressure: execute, by the computer system, the production well      │
│ model to determine a flow rate of the surface leak based on the     │
│ each pressure value                                                 │
│                              520                                    │
└─────────────────────────────────────────────────────────────────────┘
                                   │
                                   ▼
┌─────────────────────────────────────────────────────────────────────┐
│ Generate, on a display device of the computer system, a graphical   │
│ representation of the flow rate of the surface leak                 │
│                              524                                    │
└─────────────────────────────────────────────────────────────────────┘
```

DETERMINATION OF A SURFACE LEAK RATE IN AN INJECTION WELL

TECHNICAL FIELD

This description relates generally to fluid flow through a well, for example, an injection well.

BACKGROUND

An injection well is one in which injection fluids, such as water, wastewater, brine (salt water), or water mixed with chemicals are typically injected underground into rock formations. The injection fluids maintain the reservoir pressure or heat hydrocarbons within the reservoir, allowing the hydrocarbons to flow to a producing location, for example, a production well.

SUMMARY

Methods for determination of a surface leak rate in an injection well include using a computer system to determine a presence of a surface leak in an injection well based on measured visual identification at a surface of the injection well that is usually associated with abnormal decrease in pressure. The computer system generates an injection well performance model of the injection well based on a reservoir pressure of the injection well, a fluid injection pressure, properties of an injection fluid used in the injection well, and dimensions of the injection well. The computer system calibrates the injection well performance model using a shut-in bottomhole pressure of the injection well and injection data of the injection well. The shut-in bottomhole pressure and the injection data are measured prior to the determining of the presence of the surface leak. The injection data includes a fluid injection rate and the fluid injection pressure. The computer system generates a production well model of the injection well from the injection well performance model. For each pressure value of multiple pressure values between the pressure of the injection well measured at the surface and a shut-in wellhead pressure (SIWHP) of the injection well, the computer system executes the production well model to determine a flow rate of the surface leak based on each pressure value. The computer system generates a graphical representation of the flow rate of the surface leak on a display device.

DETAILED DESCRIPTION

The implementations disclosed provide methods, apparatus, and systems for generating and simulating models of an injection well to determine a flow rate of a surface leak in the injection well. A surface leak can develop at a wellhead of the injection well or at a flow line connected to the wellhead, affecting the integrity of the injection well as well as posing challenges to the hydrocarbon recovery process. An injection well performance model of the injection well is generated responsive to determining the presence of the surface leak. An injection well performance model is a steady-state multiphase simulation software model of the injection well based on measured parameters of the injection well, such as a fluid injection pressure, reservoir pressure, injection fluid properties, and the well dimensions.

A production well model of the injection well is generated from the injection well performance model. The production well model is a steady-state multiphase simulation software model of the injection well that uses nodal analysis, based on single-phase and multiphase flow equations, to determine the well injection behavior in terms of outputs such as a flow rate (sometimes referred to as an "injection rate") and a pressure profile. The flow rate refers to the volume of fluid, which passes out of the injection well per unit time. The flow rate determined from the production well model indicates the surface leak rate of the injection well.

Among other benefits and advantages, the methods provide a flexible and integrated framework for determination of a flow rate of a surface leak in an injection well. The implementations determine a surface leak rate at a wellhead or a flowline of the wellhead of the injection well. The extent of the surface leak is determined without requiring metering devices, thus reducing production costs and providing environmental benefits especially when the surface leak is related to hydrocarbons or hydrogen sulfide. Moreover, the implementations provide the ability to determine the size of the surface leak without requiring the size of the surface leak to be an input in determining the flow rate of the surface leak.

Figure 1:
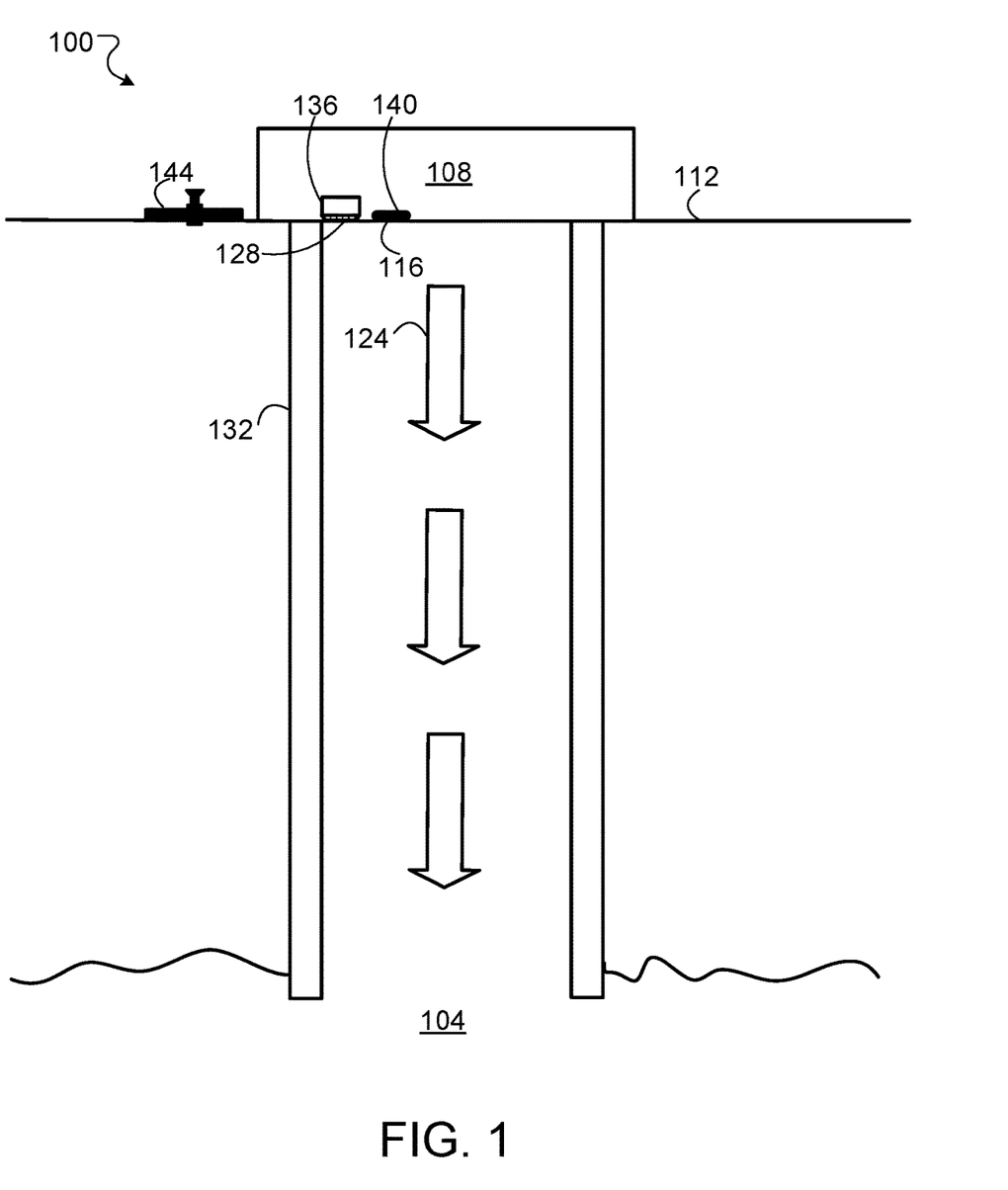
FIG. 1 illustrates a schematic of an injection well, in accordance with one or more implementations.

FIG. 1 illustrates a schematic of an injection well 100, in accordance with one or more implementations. The injection well 100 is used to flow injection fluid 124, such as water, wastewater, brine (salt water), or water mixed with chemicals, into a subterranean zone that includes a formation, a portion of a formation, or multiple formations, for example, sandstone, limestone or other formations. The injection well 100 can be used for hydrocarbon recovery from the hydrocarbon reservoir 104 shown in FIG. 1. For example, fluid 124 such as steam, carbon dioxide, or water can be injected into the hydrocarbon reservoir 104 to maintain reservoir pressure, or heat the hydrocarbons in the reservoir 104, thereby allowing the hydrocarbons to be recovered from the reservoir 104 through other production wells.

A surface leak 140 can develop at a location 116 on the surface 112 of the injection well 100. For example, the surface leak 140 at location 116 can be on the wellhead 108 or a flowline 144 of the injection well 100. In practice, the surface leak 140 can be located at any part of the wellhead 108, the valves of the wellhead 108, or along a segment of the flowline 144. The surface leak 140 causes fluids to leak at the surface 112 where pressure is less. Such a leak affects the integrity of the injection well 100 and poses challenges to hydrocarbon recovery from the hydrocarbon reservoir 104.

A presence of the surface leak 140 is determined based on visual leak identification usually associated with a decrease in a pressure measured at the surface 112. The pressure at the surface 112 is measured by a pressure sensor 136 located at the surface 112. In some implementations, the pressure sensor 136 includes a ceramic pressure measuring cell, a flush diaphragm, a transducer, and an integrated controller that wirelessly communicates with the computer system 600. For example, such a computer system 600 is illustrated and described in more detail with reference to FIG. 6. The surface leak 140 is determined to be present at the location 116 in the injection well 100 where pressure has decreased.

The pressure sensor 136 is located at a location 128 on the surface 112 upstream from the surface leak 140 on the single-well flowline 144. In practice, the injection well 100 will contain several pressure sensors and gauges located at different locations at the surface 112. The pressure is measured at the different locations on the wellhead 108 and the flowline 144. In case a surface leak such as the surface leak 140 occurs, a particular pressure sensor 136 that is closest to the leak location 116 will transmit pressure measurements to the computer system 600, which will note a rapid decrease in the pressure measured by the particular sensor 136. The surface leak 140 is typically identified at the leak location 116 based on the location 128 on the surface 112. The injection well 100 is typically shut in immediately once the surface leak 140 is detected.

During normal operation of the injection well 100, prior to determining the presence of the surface leak 140, a downhole pressure gauge is lowered into the injection well 100 to repeatedly measure the shut-in bottomhole pressure. The shut-in bottomhole pressure refers to the pressure measured at the bottom of the injection well 100 when the surface valves on the injection well 100 are closed. The shut-in bottomhole pressure is caused by formation fluids at the bottom of the injection well 100. During normal operation of the injection well 100, prior to determining the presence of the surface leak, an orifice meter and one or more pressure gauges located at the wellhead 108 continuously measure injection data. The orifice meter is a flow meter used to measure the rate of flow of liquids (such as the injection fluids 124) and gases using differential pressure measurement. The injection data includes continuous measurements of the fluid injection rate of the injection fluids 124 and fluid injection pressures of the injection fluids 124. Thus multiple values of the shut-in bottomhole pressure, the fluid injection rate, and the fluid injection pressure are measured over time. The fluid injection rate ranges from 5,000 to 40,000 barrels per day ("bbl/day") at a flowing wellhead pressure ranging from 800 to 1500 pounds per square inch ("psi").

Once the presence of the surface leak 140 is determined, the computer system 600 generates an injection well performance model of the injection well 100. An example injection well performance model 200 is illustrated and described in more detail with reference to FIG. 2. The injection well performance model 200 is a software model of the injection well 100 based on measured parameters of the injection well, such as a reservoir pressure, a fluid injection pressure, injection fluid properties, and the well dimensions. The injection well performance model 200 is used to determine the performance of the injection well 100 based on the physico-chemical properties of the injection fluids 124, operational parameters such as injection rates and pressures, as well as the reservoir characteristics of the reservoir 104.

Figure 2:
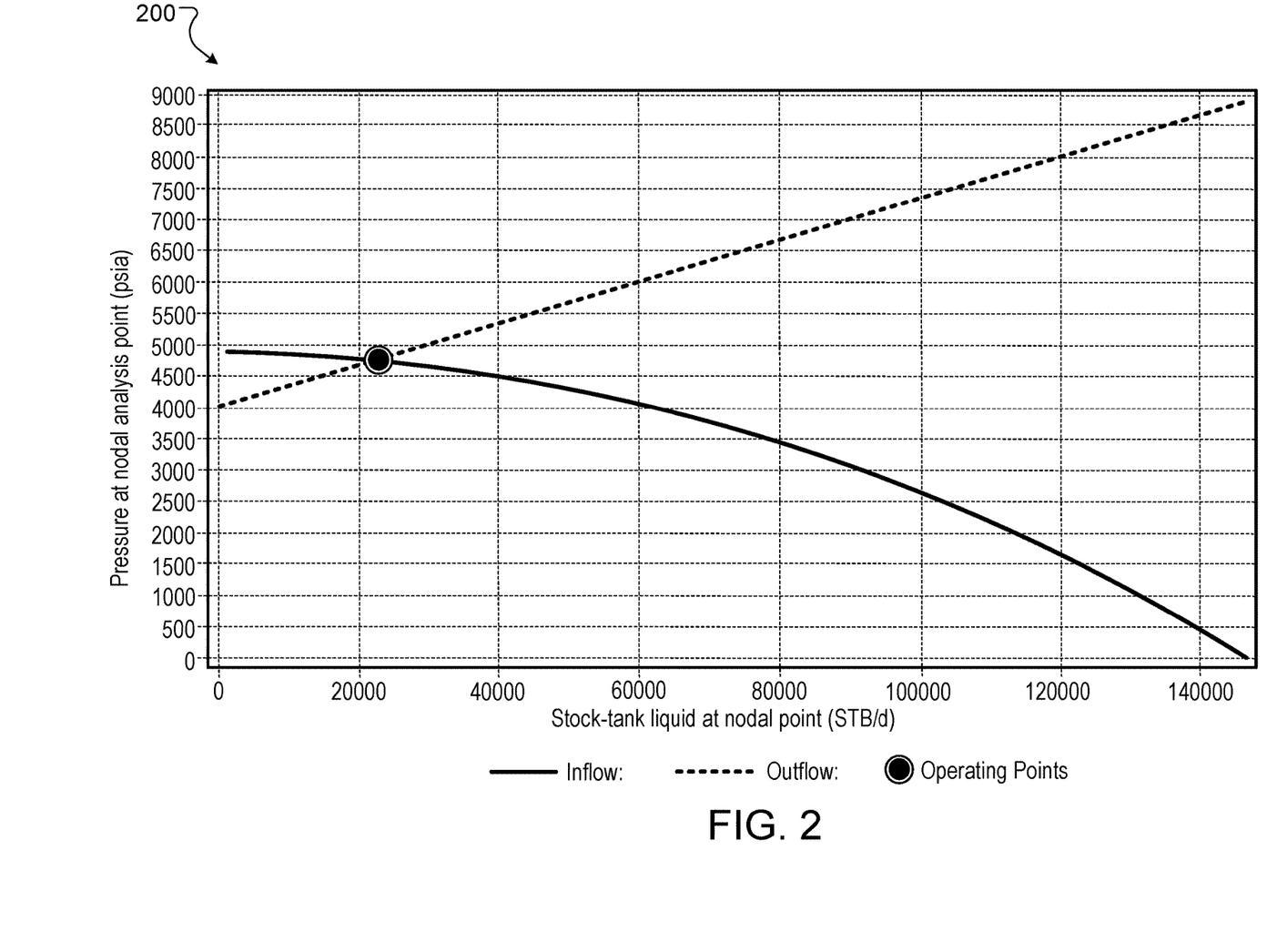
FIG. 2 illustrates inflow and outflow curves of an injection well performance model generated by a steady-state multiphase simulator, in accordance with one or more implementations.

In some implementations, the latest reservoir pressure of the reservoir 104 measured before the determination of the presence of the surface leak 140 is used to generate the injection well performance model 200. The reservoir pressure in the reservoir 104 indicates the amount of driving force available to drive fluid out of the reservoir 104 during a production sequence.

In some implementations, the latest fluid injection pressure measured before the determination of the presence of the surface leak 140 is used to generate the injection well performance model 200. The fluid injection pressure refers to the pressure in the injection well 100 resulting from a respective injection flow rate at which the injection fluid 124 is flowed through the injection well 100 from the surface 112 towards the bottomhole.

In some implementations, properties of the injection fluids 124 are used to generate the injection well performance model 200. The properties of the injection fluids 124 refer, among others, to the type of the injection fluids 124, the density of the injection fluids 124, the formation volume factor, the viscosity of the injection fluids 124, and the amount of impurities in the injection fluids 124. The formation volume factor refers to the ratio of the volume of fluids 124 at reservoir (in-situ) conditions to that at stock tank (surface) conditions. Other properties of the injection fluids 124 used to model the performance of the injection well 100 include salinity or compressibility.

In some implementations, dimensions of the injection well 100 are used to generate the injection well performance model 200. The dimensions include a diameter of the injection well 100, if the injection well 100 is uncased, or a diameter of the casing, if the injection well 100 is cased, and a depth of the injection well 100. Other information used to generate the injection well performance model 200 includes the permeability of the reservoir 104, an amount of damage to the wellbore 132, a net thickness of the reservoir 104, or a radius of the wellbore 132.

To generate the injection well performance model 200, the computer system 600 performs a pressure transient analysis (PTA) of the injection well 100. In a PTA (sometimes referred to as a "falloff test"), the fluid injection is halted and the pressure decrease is measured as a function of time. The PTA is performed at conditions representative of the performance for the injection well 100 prior to developing the surface leak 140. The PTA reduces uncertainty associated with estimating the surface leak rate (flow rate of the surface leak 140). In some implementations, the PTA is performed based on the shut-in bottomhole pressure and the injection data. If the formation pressure is large enough to maintain a full column of fluid 124 in the wellbore 132, the decrease in pressure is monitored at the surface 112. The bottomhole pressure is then determined by adding the weight of the fluid column to the surface pressure.

The computer system 600 determines an injectivity index of the injection well 100 based on the PTA to provide the injection well performance model 200. The injectivity index is a ratio between an injection flow rate of the injection fluid 124 into the injection well 100 and a difference between a downhole injection pressure resulting from the injection flow rate and a static bottomhole reservoir pressure. In some implementations, the computer system 600 estimates the injectivity index using Darcy's Law. The estimation is based on the permeability of the reservoir 104, an amount of damage to the wellbore 132, the net thickness of the reservoir 104, a radius of the wellbore 132, and the external boundary radius. The determined injectivity index is incorporated into the injection well performance model 200.

Once the different parameters for modeling the injection well 100 are collected, the injection well performance model 200 is generated by generating curves representing the bottomhole pressure and the injection flow rate of the injection fluids 124 into the injection well 100 at the surface 112 of the injection well 100. An example curve is illustrated and described in more detail with reference to FIG. 2. To model the shut-in condition of the injection well 100 during normal operation, a bottomhole pressure of the modeled shut-in injection well 100 is assigned to be the same as the bottomhole pressure of the injection well 100 measured during normal operation. The injection well performance model 200 is generated by simulating the flow characteristics and properties of the actual fluid injector to simulate the flow of the surface leak 140 at flowing (that is, injection) conditions. Performance curves are generated at different nodal pressures (measured at the location 136) for the injection well performance model 200.

The computer system 600 calibrates the generated injection well performance model 200 using the latest shut-in bottomhole pressure and the injection data of the injection well 100 measured prior to the determining of the presence of the surface leak. The computer system 600 uses steady-state, multiphase flow simulation to calibrate the generated injection well performance model 200. The calibration is performed by executing multiple scenarios for the injection well performance model 200 and comparing the results to the actual recorded flow rate and injection pressure of the injection well 100. Flow correlation is performed to estimate the decrease in pressure for both single-phase and multi-phase scenarios. In addition, inflow relationships are used for vertical and horizontal wells to estimate the pressure drop across the reservoir. Convergence of the injection well performance model 200 is achieved using regression until the simulated flow rate and the simulated pressure match the actual recorded flow rate and injection pressure. After convergence is achieved, the calibration is terminated.

FIG. 2 illustrates an example injection well performance model 200 of an injection well 100 developed by a steady-state multiphase simulator, in accordance with one or more implementations. A schematic of the injection well 100 is illustrated and described in more detail with reference to FIG. 1. The X-axis of the injection well performance model 200 indicates a fluid injection rate in barrels per day. The Y-axis of the injection well performance model 200 indicates a bottomhole fluid injection pressure in psi. The injection well performance model 200 relates the fluid injection pressure at the surface 112 of the injection well 100 to the fluid injection rate at the surface 112. The fluid injection pressure and the fluid injection rate are directly proportional to each other. The relationship between the fluid injection pressure and the fluid injection rate is used to further determine the injectivity index of the injection well 100. In some implementations, calibration operations (described in more detail with reference to FIG. 1) are implemented to calibrate the injection well performance model 200.

Figure 3:
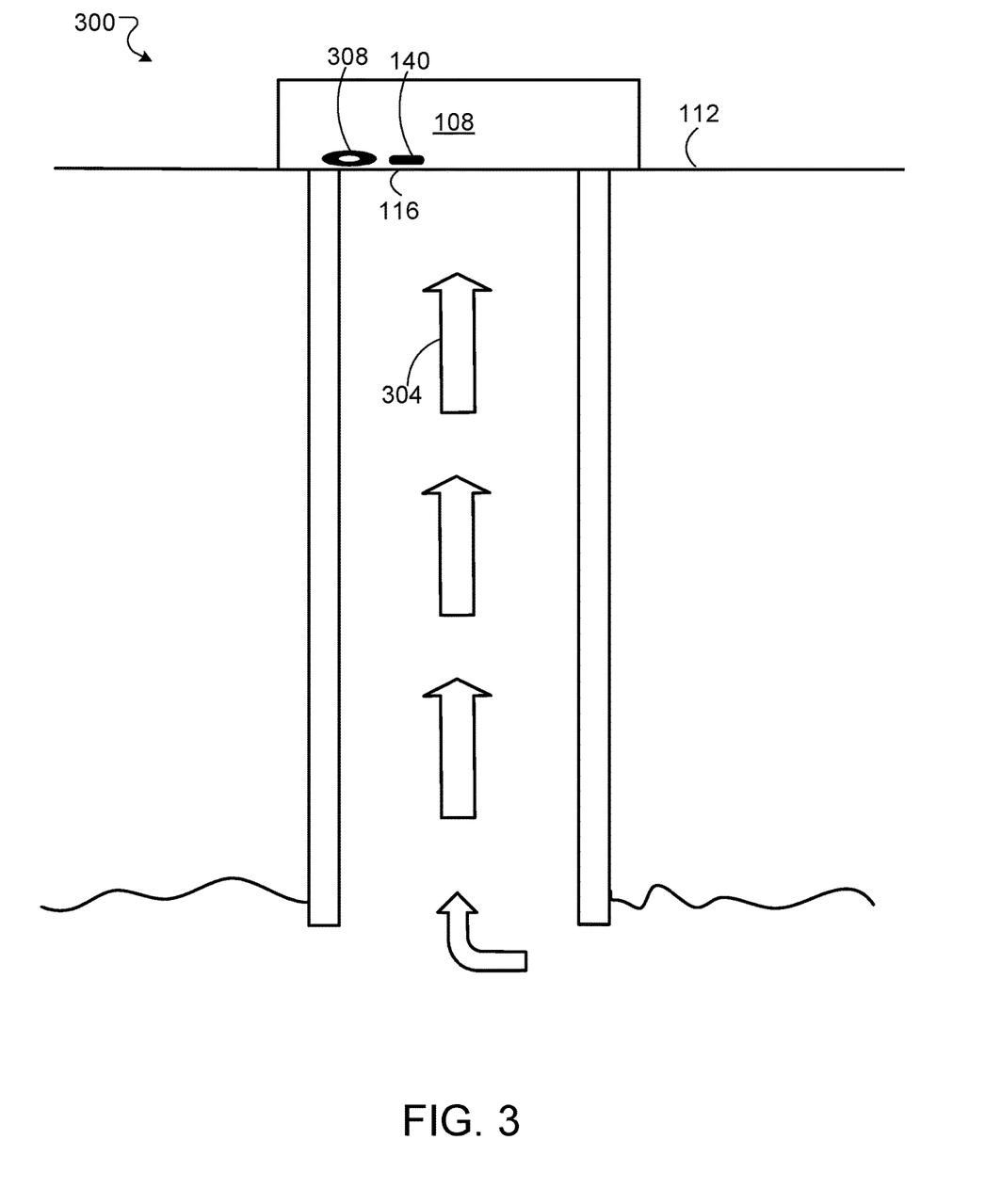
FIG. 3 illustrates a schematic of a production well, in accordance with one or more implementations.

FIG. 3 illustrates a schematic of a production well 300, in accordance with one or more implementations. The schematic of the production well 300 is based on the injection well 100; however, the direction of the flow of the fluid 304 is reversed with respect to the direction of flow of the fluid 124 illustrated with reference to FIG. 1. The direction of the flow is a representational input changed by the computer system 600 that simulates the direction of the flow from or to the reservoir 104. The computer system 600 generates a production well model of the injection well 100 based on the production well 300. The computer system 600 is illustrated and described in more detail with reference to FIG. 6. An example production well model 400 is illustrated with reference to FIG. 4. The production well model 400 is generated from the injection well performance model 200 illustrated and described in more detail with reference to FIG. 2.

Figure 4:
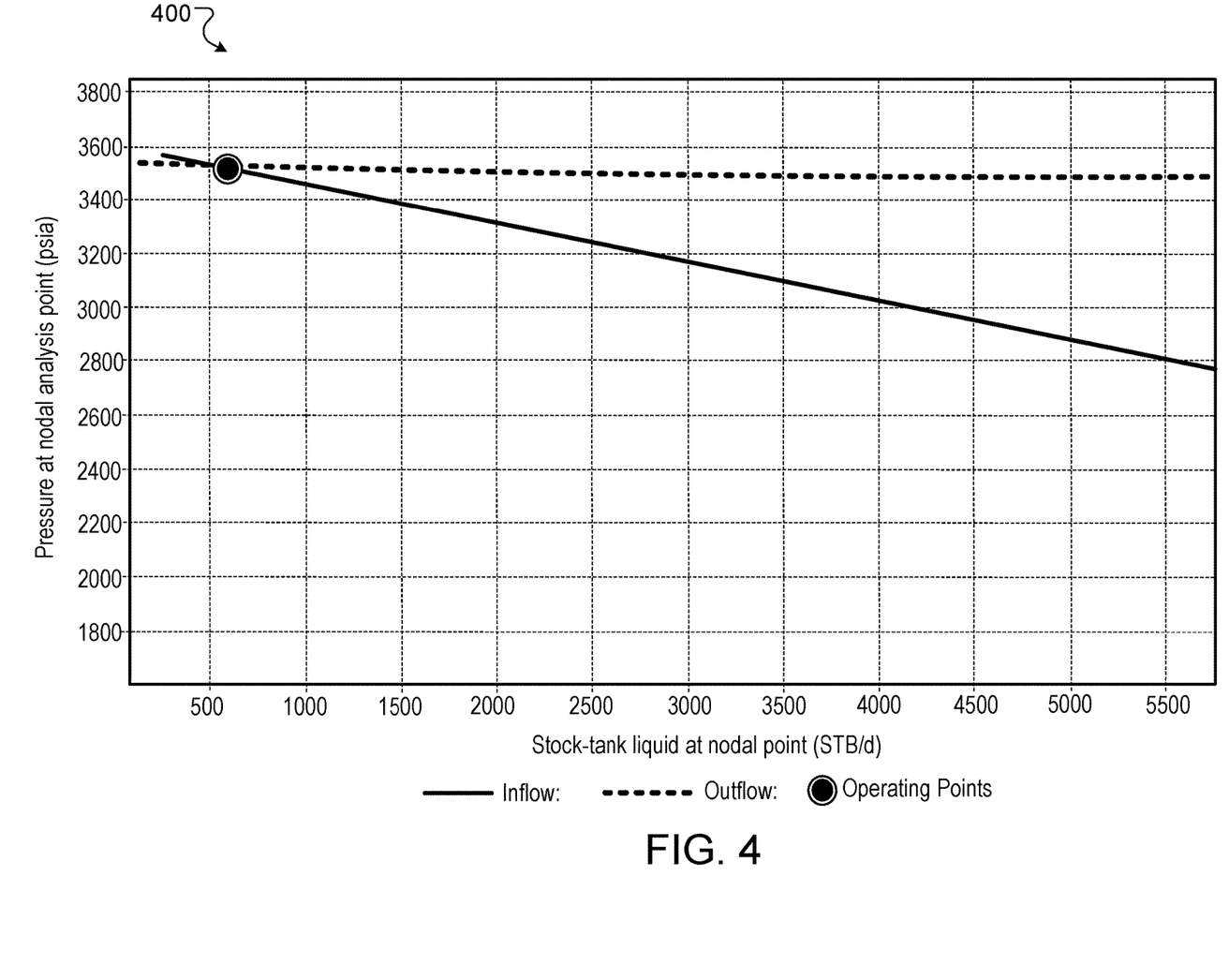
FIG. 4 illustrates inflow and outflow curves of a production well model generated by a steady-state multiphase simulator, in accordance with one or more implementations.

To generate the production well model 400, the computer system 600 uses the input data determined previously for the injection well performance model 200. The input data includes the boundary pressure (reservoir pressure), the injection fluid properties (type, density, formation volume factor, viscosity, and the amount of impurities), the dimensions of the injection well 100 (casing, tubing, and other completion accessories), and the injectivity index determined by PTA or estimated by Darcy's Law. The determination of the injectivity index is described in more detail with reference to FIG. 1.

In generating the production well model 400, the computer system 600 simulates a choke 308 to model the surface leak 140 in the injection well performance model 200 at the surface 112 of the injection well 100. The choke 308 is used for regression of the production well model 400 on the leak size and rate until convergence is achieved. The simulated choke 308 is operably coupled to a pressure sink associated with the pressure of the injection well 100 measured at the surface 112. The boundary condition at the pressure sink is the pressure of the injection well 100 measured at the surface 112.

The computer system 600 executes the production well model 400 of the injection well 100 at different surface pressure values. The different surface pressure values used for executing the production well model 400 range from the pressure of the injection well 100 measured at the surface 112 to a shut-in wellhead pressure (SIWHP) of the injection well 100. The SIWHP refers to the surface force per unit area measured at the wellhead 108 when the injection well 100 is closed (and there is no surface leak). The SIWHP results from the reservoir 104 or an external source. The computer system 600 executes the production well model 400 of the injection well 100 to determine a flow rate of the surface leak 140 based on each surface pressure value simulated. The computer system 600 determines that the values defining the production well model 400 have converged when the simulated pressure value equals the reported pressure from the pressure sensor 136 installed on the wellhead 108 or flowline 144. When the values defining the production well model 400 converge, the resulting flow rate is determined to be the flow rate of the surface leak 140.

Prior to the values defining the production well model 400 converging, the execution of the production well model 400 results in the determination that the flow rate of the surface leak 140 is greater than zero (a flow rate when the surface pressure value equals the SIWHP—absence of surface leak condition). In such a simulated absence of a surface leak at the SIWHP condition, the flow rate prior to the surface leak 140 should preferably be zero. Responsive to determining that the flow rate of the simulated surface leak is greater than zero, the computer system 600 re-calibrates the injection well performance model 200 using the pressure of the injection well 100 measured at the surface 112. Several such cycles of comparing the determined flow rate at the SIWHP condition are performed until the values defining the production well model 400 converges.

In some implementations, the execution of the production well model 400 further includes determining a pressure profile of the injection well 100. The pressure profile reflects the pressure gradient and distribution of fluids at different depths in the injection well 100, indicating any compartmentalization resulting from fluid flow barriers. In some implementations, the execution of the production well model 400 includes determining a velocity profile of the injection well 100. The velocity profile includes the shape of the velocity curve across a section of the injection well 100, indicating the laminar or turbulent flow of the injection fluids 124. In some implementations, the execution of the production well model 400 includes determining a temperature profile of the injection well 100. The temperature profile reflects the temperature behavior of the injection well 100 for the given water-injection conditions including the shut-in temperature profile to indicate the effect of the fluid injection rate, surface water temperature, and shut-in time on the downhole temperature profile.

The computer system 600 generates a graphical representation on a display device (for example, the display device 624) of the computer system 600. The display device 624 is illustrated and described in more detail with reference to FIG. 6. The graphical representation portrays the flow rate of the surface leak 140. The graphical representation can include text, pie charts, bar graphs, and numerical values. In some implementations, the graphical representation portrays a pressure profile of the injection well 100, a velocity profile of the injection well 100, or a temperature profile of the injection well 100. Responsive to determining the surface leak rate, the environmental impact of the surface leak 140 can be determined and the surface leak 140 can be repaired.

FIG. 4 illustrates an example production well model 400 of the injection well 100, in accordance with one or more implementations. A schematic of the injection well 100 is illustrated and described in more detail with reference to FIG. 1. The X-axis of the production well model 400 indicates a flow rate (sometimes referred to as a "production rate") in barrels per day. The Y-axis of the production well model 400 indicates a bottomhole flow pressure in psi. The flow pressure refers to the pressure measured at the pressure sink. The pressure sink is described in more detail with reference to FIG. 3. The flow pressure and the flow rate are inversely proportional to each other.

Figure 5:
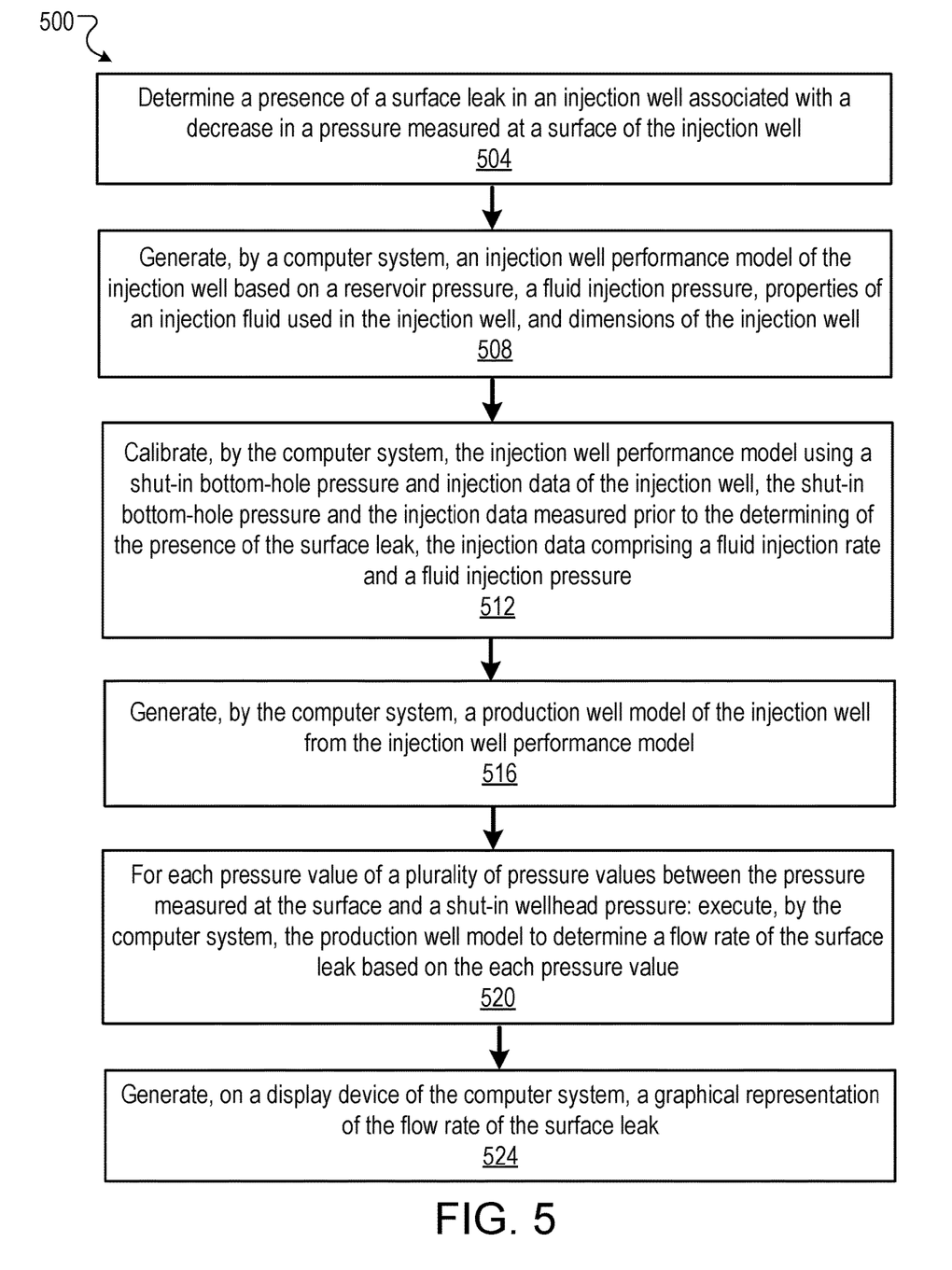
FIG. 5 illustrates a process for determination of a surface leak rate in an injection well, in accordance with one or more implementations.

FIG. 5 illustrates a process 500 for determination of a surface leak rate in an injection well 100, in accordance with one or more implementations. An injection well performance model 200 of an injection well 100 is illustrated and described in more detail with reference to FIG. 1. In some implementations, the process 500 is performed by the computer system 600 illustrated and described in more detail with reference to FIG. 4.

A presence of a surface leak 140 in an injection well 100 is determined 504 based on visual leak identification or a decrease in a pressure of the injection well 100 measured at a surface 112 of the injection well 100. The surface 112 is illustrated with reference to FIG. 1. The surface leak 140 is typically associated with an abnormal decrease in the pressure of the injection well 100 is measured by a pressure sensor 136 located on the surface 112. In some implementations, the pressure sensor 136 includes a ceramic pressure measuring cell, a flush diaphragm, a transducer, and an integrated controller that wirelessly communicates with the computer system 600.

The computer system 600 generates 508 an injection well performance model 200 of the injection well 100. The injection well performance model 200 is generated based on a reservoir pressure of the injection well 100, a fluid injection pressure, properties of an injection fluid used in the injection well 100, and dimensions of the injection well 100. The reservoir pressure in the reservoir 104 indicates an amount of driving force available to drive the remaining fluid out of the reservoir 104 during a production sequence. The fluid injection pressure refers to the pressure in the injection well 100 resulting from a respective injection rate at which the injection fluid 124 is flowed through the injection well 102 from the surface 112 towards the bottomhole. The properties of the injection fluids 124 refer, among others, to the type of the injection fluids 124, the density of the injection fluids 124, the formation volume factor, the viscosity of the injection fluids 124, and the amount of impurities in the injection fluids 124. The dimensions of the injection well 100 include information about the type of casing or tubing used.

The computer system 600 calibrates 512 the injection well performance model 200 using a shut-in bottomhole pressure of the injection well 100 and injection data of the injection well 100. The shut-in bottomhole pressure and the injection data are measured prior to the determining of the presence of the surface leak. The injection data includes an injection rate and the fluid injection pressure. The computer system 600 uses steady-state, multiphase flow simulation to calibrate the generated injection well performance model 200. The calibration is performed by executing multiple scenarios for the injection well performance model 200 and comparing the results to the actual recorded flow rate and injection pressure of the injection well 100. Flow correlation is performed to estimate the decrease in pressure for both single-phase and multiphase scenarios. In addition, inflow relationships are used for vertical and horizontal wells to estimate pressure drop across a reservoir.

The computer system 600 generates 516 a production well model 400 of the injection well 100 from the injection well performance model 200. The production well model 400 is illustrated and described in more detail with reference to FIG. 2. To generate the production well model 400, the computer system 600 reverses the direction of flow of the injection fluids 124 from injection to production. The production well model 400 inherits the input data determined previously for the injection well 100. The input data includes the boundary pressure (reservoir pressure), the injection fluid properties (type, density, formation volume factor, viscosity, and the amount of impurities), the dimensions of the injection well 100 (casing, tubing, and other completion accessories), and the injectivity index determined by PTA or estimated by Darcy's Law. The determination of the injectivity index for the injection well 100 is described in more detail with reference to FIG. 1.

For each pressure value of multiple pressure values between the pressure of the injection well 100 measured at the surface 112 and the SIWHP of the injection well 100, the computer system 600 executes 520 the production well model 400. The production well model 400 of the injection well 100 is executed to determine a flow rate of the surface leak based on each pressure value. The SIWHP refers to the surface force per unit area measured at the wellhead 108 when the injection well 100 is closed (and there is no surface leak). The SIWHP results from the reservoir 104 or an external source. The computer system 600 executes the production well model 400 of the injection well 100 to determine a flow rate of the surface leak based on each surface pressure value simulated. When the values defining the production well model 400 converge, the resulting production rate is determined to be the flow rate of the surface leak.

The computer system 600 generates 524 a graphical representation on a display device (for example, the display device 624) of the computer system 600. The display device 624 is illustrated and described in more detail with reference to FIG. 4. The graphical representation portrays the flow rate of the surface leak. The graphical representation can include text, pie charts, bar graphs, and numerical values. In some implementations, the graphical representation portrays a pressure profile of the injection well 100, a velocity profile of the injection well 100, or a temperature profile of the injection well 100.

Figure 6:
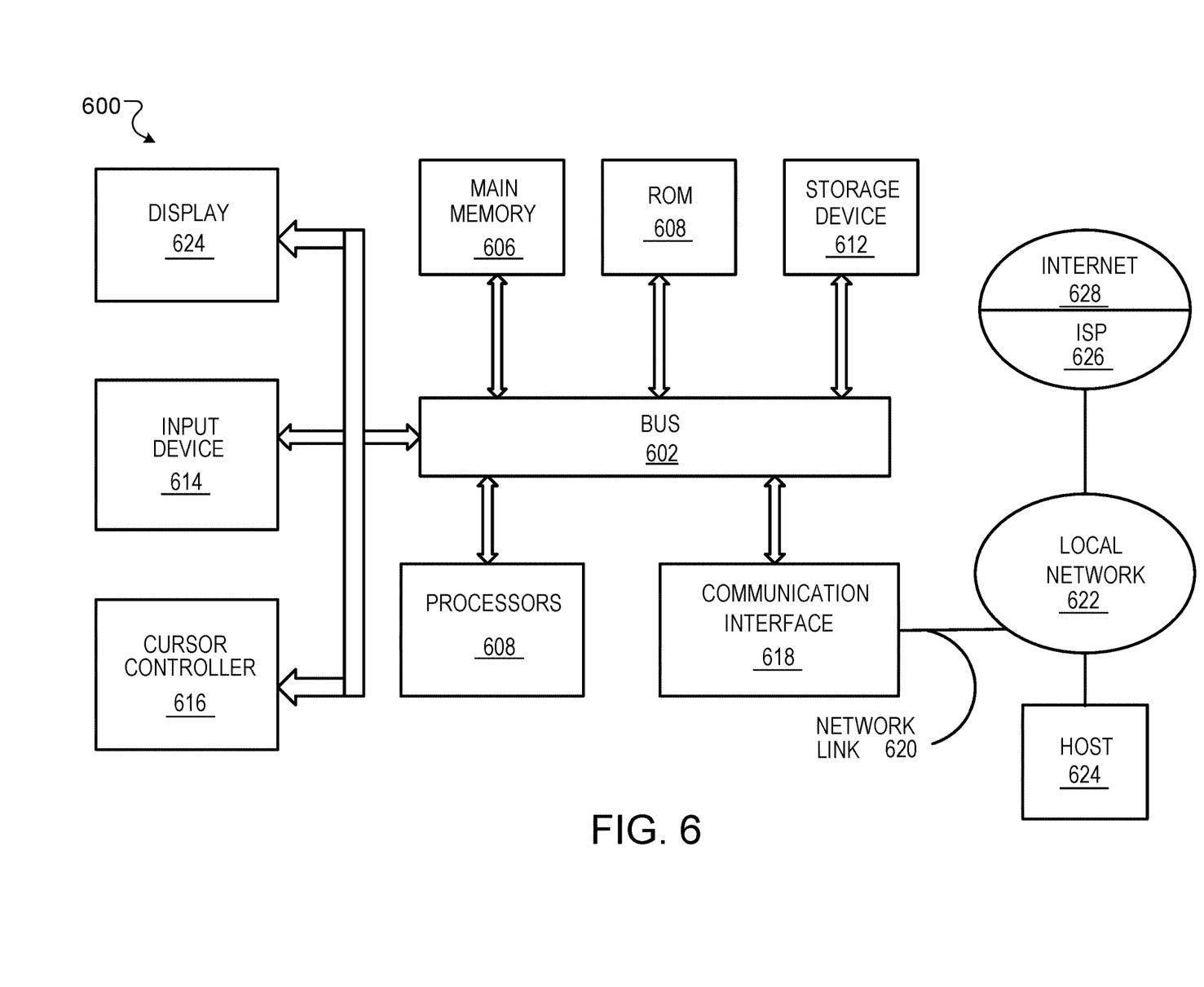
FIG. 6 illustrates an example machine for determination of a surface leak rate in an injection well, in accordance with one or more implementations.

FIG. 6 illustrates an example machine 600 for determination of a surface leak rate in an injection well 100, in accordance with one or more implementations. In the example implementation, the computer system 600 is a special purpose computing device. The special-purpose computing device is hard-wired to determine a surface leak rate in the injection well 100 or includes digital electronic devices such as one or more application-specific integrated circuits (ASICs) or field programmable gate arrays (FPGAs) that are persistently programmed to perform the techniques herein, or can include one or more general purpose hardware processors programmed to perform the techniques pursuant to program instructions in firmware, memory, other storage, or a combination. Such special-purpose computing devices can also combine custom hard-wired logic, ASICs, or FPGAs with custom programming to accomplish the techniques. In various embodiments, the special-purpose computing devices are desktop computer systems, portable computer systems, handheld devices, network devices or any other device that incorporates hard-wired and/or program logic to implement the techniques.

In an embodiment, the computer system 600 includes a bus 602 or other communication mechanism for communicating information, and one or more computer hardware processors 608 coupled with the bus 602 for processing information. The hardware processors 608 are, for example, general-purpose microprocessors. The computer system 600 also includes a main memory 606, such as a random-access memory (RAM) or other dynamic storage device, coupled to the bus 602 for storing information and instructions to be executed by processors 608. In one implementation, the main memory 606 is used for storing temporary variables or other intermediate information during execution of instructions to be executed by the processors 608. Such instructions, when stored in non-transitory storage media accessible to the processors 608, render the computer system 600 into a special-purpose machine that is customized to perform the operations specified in the instructions.

In an embodiment, the computer system 600 further includes a read only memory (ROM) 608 or other static storage device coupled to the bus 602 for storing static information and instructions for the processors 608. A storage device 612, such as a magnetic disk, optical disk, solid-state drive, or three-dimensional cross point memory is provided and coupled to the bus 602 for storing information and instructions.

In an embodiment, the computer system 600 is coupled via the bus 602 to a display 624, such as a cathode ray tube (CRT), a liquid crystal display (LCD), plasma display, light emitting diode (LED) display, or an organic light emitting diode (OLED) display for displaying information to a computer user. An input device 614, including alphanumeric and other keys, is coupled to bus 602 for communicating information and command selections to the processors 608. Another type of user input device is a cursor controller 616, such as a mouse, a trackball, a touch-enabled display, or cursor direction keys for communicating direction information and command selections to the processors 608 and for controlling cursor movement on the display 624. This input device typically has two degrees of freedom in two axes, a first axis (e.g., x-axis) and a second axis (e.g., y-axis), that allows the device to specify positions in a plane.

According to one embodiment, the techniques herein are performed by the computer system 600 in response to the processors 608 executing one or more sequences of one or more instructions contained in the main memory 606. Such instructions are read into the main memory 606 from another storage medium, such as the storage device 612. Execution of the sequences of instructions contained in the main memory 606 causes the processors 608 to perform the process steps described herein. In alternative embodiments, hard-wired circuitry is used in place of or in combination with software instructions.

The term "storage media" as used herein refers to any non-transitory media that store data and/or instructions that cause a machine to operate in a specific fashion. Such storage media includes non-volatile media and/or volatile media. Non-volatile media includes, for example, optical disks, magnetic disks, solid-state drives, or three-dimensional cross point memory, such as the storage device 612. Volatile media includes dynamic memory, such as the main memory 606. Common forms of storage media include, for example, a floppy disk, a flexible disk, hard disk, solid-state drive, magnetic tape, or any other magnetic data storage medium, a CD-ROM, any other optical data storage medium, any physical medium with patterns of holes, a RAM, a PROM, and EPROM, a FLASH-EPROM, NV-RAM, or any other memory chip or cartridge.

Storage media is distinct from but can be used in conjunction with transmission media. Transmission media participates in transferring information between storage media. For example, transmission media includes coaxial cables, copper wire and fiber optics, including the wires that include the bus 602. Transmission media can also take the form of acoustic or light waves, such as those generated during radio-wave and infrared data communications.

In an embodiment, various forms of media are involved in carrying one or more sequences of one or more instructions to the processors 608 for execution. For example, the instructions are initially carried on a magnetic disk or solid-state drive of a remote computer. The remote computer loads the instructions into its dynamic memory and send the instructions over a telephone line using a modem. A modem local to the computer system 600 receives the data on the telephone line and use an infrared transmitter to convert the data to an infrared signal. An infrared detector receives the data carried in the infrared signal and appropriate circuitry places the data on the bus 602. The bus 602 carries the data to the main memory 606, from which processors 608 retrieves and executes the instructions. The instructions received by the main memory 606 can optionally be stored on the storage device 412 either before or after execution by processors 608.

The computer system 600 also includes a communication interface 618 coupled to the bus 602. The communication interface 418 provides a two-way data communication coupling to a network link 620 that is connected to a local network 422. For example, the communication interface 618 is an integrated service digital network (ISDN) card, cable modem, satellite modem, or a modem to provide a data communication connection to a corresponding type of telephone line. As another example, the communication interface 618 is a local area network (LAN) card to provide a data communication connection to a compatible LAN. In some implementations, wireless links are also implemented. In any such implementation, the communication interface 418 sends and receives electrical, electromagnetic, or optical signals that carry digital data streams representing various types of information.

The network link 620 typically provides data communication through one or more networks to other data devices. For example, the network link 620 provides a connection through the local network 622 to a host computer 624 or to a cloud data center or equipment operated by an Internet Service Provider (ISP) 626. The ISP 626 in turn provides data communication services through the world-wide packet data communication network now commonly referred to as the "Internet" 628. The local network 622 and Internet 628 both use electrical, electromagnetic or optical signals that carry digital data streams. The signals through the various networks and the signals on the network link 620 and through the communication interface 618, which carry the digital data to and from the computer system 600, are example forms of transmission media.

The computer system 600 sends messages and receives data, including program code, through the network(s), the network link 620, and the communication interface 618. In an embodiment, the computer system 600 receives code for processing. The received code is executed by the processors 608 as it is received, and/or stored in storage device 612, or other non-volatile storage for later execution.

What is claimed is:

1. A method comprising:
generating, by a computer system, an injection well performance model of an injection well responsive to determining of a presence of a surface leak in the injection well, the injection well performance model based on a reservoir pressure of the injection well, a fluid injection pressure, properties of an injection fluid used in the injection well, and dimensions of the injection well;
calibrating, by the computer system, the injection well performance model using a shut-in bottomhole pressure of the injection well and injection data of the injection well, the shut-in bottomhole pressure and the injection data measured prior to the determining of the presence of the surface leak, the injection data comprising a fluid injection rate and the fluid injection pressure, wherein the calibrating comprises using regression to converge values defining the injection well performance model;
generating, by the computer system, a production well model of the injection well from the injection well performance model;
for each pressure value of a plurality of pressure values between a pressure of the injection well measured at the surface and a shut-in wellhead pressure (SIWHP) of the injection well:
executing, by the computer system, the production well model to determine a flow rate of the surface leak based on the each pressure value;
executing, by the computer system, the production well model of the injection well to determine that the flow rate of the surface leak is greater than zero when the pressure value equals the SIWHP;
responsive to the determining that the flow rate is greater than zero, re-calibrating, by the computer system, the injection well performance model using the pressure of the injection well measured at the surface until the flow rate equals zero; and
generating, on a display device of the computer system, a graphical representation of the flow rate of the surface leak.

2. The method of claim 1, wherein the generating of the injection well performance model comprises:
performing, by the computer system, a pressure transient analysis (PTA) of the injection well based on the shut-in bottomhole pressure and the injection data; and
determining, by the computer system, an injectivity index of the injection well based on the PTA to provide the injection well performance model.

3. The method of claim 1, further comprising measuring, by a pressure sensor, the pressure of the injection well at the surface, the pressure measured at a location on a wellhead of the injection well or a flow line of the injection well upstream from the surface leak.

4. The method of claim 1, wherein the generating of the production well model comprises simulating, by the computer system, a choke in the injection well performance model located at the surface of the injection well, the choke operably coupled to a pressure sink associated with the pressure of the injection well measured at the surface.

5. The method of claim 1, further comprising:
lowering a downhole pressure gauge into the injection well to measure the shut-in bottomhole pressure; and
measuring, by an orifice meter and one or more pressure gauges located at a wellhead of the injection well, the injection data to perform the calibration of the injection well performance model.

6. The method of claim 1, wherein the executing of the production well model comprises determining, by the computer system, a pressure profile of the injection well, a velocity profile of the injection well, and a temperature profile of the injection well.

7. A non-transitory computer-readable storage medium storing instructions executable by a computer system, the instructions when executed by the computer system cause the computer system to:
generate an injection well performance model of an injection well responsive to determining a presence of a surface leak in the injection well, the injection well performance model based on a reservoir pressure of the injection well, a fluid injection pressure, properties of an injection fluid used in the injection well, and dimensions of the injection well;
calibrate the injection well performance model using a shut-in bottomhole pressure of the injection well and injection data of the injection well, the shut-in bottomhole pressure and the injection data measured prior to the determining of the presence of the surface leak, the injection data comprising a fluid injection rate and the fluid injection pressure, wherein calibrating comprises using regression to converge values defining the injection well performance model;
generate a production well model of the injection well from the injection well performance model; and
for each pressure value of a plurality of pressure values between a pressure of the injection well measured at the surface and a shut-in wellhead pressure (SIWHP) of the injection well:
execute the production well model to determine a flow rate of the surface leak based on the each pressure value;
executing, by the computer system, the production well model of the injection well to determine that the flow rate of the surface leak is greater than zero when the pressure value equals the SIWHP; and
responsive to the determining that the flow rate is greater than zero, re-calibrating, by the computer system, the injection well performance model using the pressure of the injection well measured at the surface until the flow rate equals zero.

8. The non-transitory computer-readable storage medium of claim 7, wherein the generating of the injection well performance model comprises:
performing, by the computer system, a pressure transient analysis (PTA) of the injection well based on the shut-in bottomhole pressure and the injection data; and
determining, by the computer system, an injectivity index of the injection well based on the PTA to provide the injection well performance model.

9. The non-transitory computer-readable storage medium of claim 7, wherein the instructions further cause the computer system to measure, by a pressure sensor, the pressure of the injection well at the surface, the pressure measured at a location on a wellhead of the injection well or a flow line of the injection well upstream of the surface leak.

10. The non-transitory computer-readable storage medium of claim 7, wherein the generating of the production well model comprises simulating, by the computer system, a choke in the injection well performance model at the surface of the injection well, the choke operably coupled to a pressure sink representing boundary conditions.

11. The non-transitory computer-readable storage medium of claim 7, wherein the instructions further cause the computer system to:
lower a downhole pressure gauge into the injection well to measure the shut-in bottomhole pressure; and
measure, by an orifice meter and one or more pressure gauges located at a wellhead of the injection well, the injection data to perform the calibration of the injection well performance model.

12. The non-transitory computer-readable storage medium of claim 7, wherein the executing of the production well model comprises determining a pressure profile of the injection well, a velocity profile of the injection well, and a temperature profile of the injection well.

13. A computer system comprising:
one or more computer processors; and
a non-transitory computer-readable storage medium storing instructions executable by the one or more computer processors, the instructions when executed by the one or more computer processors cause the one or more computer processors to:
generate an injection well performance model of an injection well responsive to determining a presence of a surface leak in the injection well, the injection well performance model based on a reservoir pressure of the injection well, a fluid injection pressure, properties of an injection fluid used in the injection well, and dimensions of the injection well;
calibrate the injection well performance model using a shut-in bottomhole pressure of the injection well and injection data of the injection well, the shut-in bottomhole pressure and the injection data measured prior to the determining of the presence of the surface leak, the injection data comprising a fluid injection rate and the fluid injection pressure, wherein the calibrating comprises using regression to converge values defining the injection well performance model;
generate a production well model of the injection well from the injection well performance model; and
for each pressure value of a plurality of pressure values between a pressure of the injection well measured at the surface and a shut-in wellhead pressure (SIWHP) of the injection well:
execute the production well model to determine a flow rate of the surface leak based on the each pressure value
executing, by the computer system, the production well model of the injection well to determine that the flow rate of the surface leak is greater than zero when the pressure value equals the SIWHP; and
responsive to the determining that the flow rate is greater than zero, re-calibrating, by the computer system, the injection well performance model using the pressure of the injection well measured at the surface until the flow rate equals zero.

14. The computer system of claim 13, wherein the generating of the injection well performance model comprises:
performing, by the computer system, a pressure transient analysis (PTA) of the injection well based on the shut-in bottomhole pressure and the injection data; and
determining, by the computer system, an injectivity index of the injection well based on the PTA to provide the injection well performance model.

15. The computer system of claim 13, wherein the instructions further cause the computer system to measure, by a pressure sensor, the pressure of the injection well at the surface, the pressure measured at a location on a wellhead of the injection well or a flow line of the injection well upstream of the surface leak.

16. The computer system of claim 13, wherein the generating of the production well model comprises simulating, by the computer system, a choke in the injection well performance model at the surface of the injection well, the choke operably coupled to a pressure sink associated with the pressure of the injection well measured at the surface.

17. The computer system of claim 13, wherein the instructions further cause the computer system to:
lower a downhole pressure gauge into the injection well to measure the shut-in bottomhole pressure; and
measure, by an orifice meter and one or more pressure gauges located at a wellhead of the injection well, the injection data to perform the calibration of the injection well performance model.

* * * * *